(12) United States Patent
Ahn et al.

(10) Patent No.: US 6,680,228 B2
(45) Date of Patent: Jan. 20, 2004

(54) CAPACITOR IN SEMICONDUCTOR DEVICE

(75) Inventors: Byoung Kwon Ahn, Seoul (KR); Dong Soo Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/268,964

(22) Filed: Oct. 11, 2002

(65) Prior Publication Data
US 2003/0039091 A1 Feb. 27, 2003

Related U.S. Application Data

(62) Division of application No. 09/879,998, filed on Jun. 14, 2001, now Pat. No. 6,479,345.

(30) Foreign Application Priority Data

Jun. 30, 2000 (KR) .......................................... 2000-36811

(51) Int. Cl.⁷ ...................... H01L 21/8242; H01L 21/20
(52) U.S. Cl. ...................... 438/253; 438/240; 438/393; 438/396
(58) Field of Search ................................ 438/240, 253, 438/386, 393, 250, 239, 785–788, 396, 3; 257/296, 310, 306, 309

(56) References Cited

U.S. PATENT DOCUMENTS

| | | | | | |
|---|---|---|---|---|---|
| 5,120,572 | A | * | 6/1992 | Kumar | 216/16 |
| 5,254,493 | A | * | 10/1993 | Kumar | 216/16 |
| 5,685,968 | A | * | 11/1997 | Hayakawa et al. | 205/122 |
| 5,952,687 | A | * | 9/1999 | Kawakubo et al. | 257/296 |
| 6,180,542 | B1 | * | 1/2001 | Hwang | 438/785 |
| 6,335,241 | B1 | * | 1/2002 | Hieda et al. | 438/253 |
| 6,338,995 | B1 | * | 1/2002 | Hwang et al. | 438/240 |
| 6,340,622 | B1 | * | 1/2002 | Lee et al. | 438/396 |
| 6,342,712 | B1 | * | 1/2002 | Miki et al. | 257/295 |
| 6,365,486 | B1 | * | 4/2002 | Agarwal et al. | 438/393 |
| 6,458,645 | B2 | * | 10/2002 | DeBoer et al. | 438/240 |
| 6,479,345 | B2 | * | 11/2002 | Ahn et al. | 438/253 |
| 6,492,226 | B1 | * | 12/2002 | Hsue et al. | 438/253 |
| 6,495,414 | B2 | * | 12/2002 | Han et al. | 438/250 |
| 6,515,324 | B2 | * | 2/2003 | Shibuya et al. | 257/296 |
| 6,573,547 | B2 | * | 6/2003 | Ahn et al. | 257/296 |
| 6,599,807 | B2 | * | 7/2003 | Lim et al. | 438/396 |

* cited by examiner

*Primary Examiner*—Michael S. Lebentritt
(74) *Attorney, Agent, or Firm*—Birch, Stewart, Kolasch & Birch, LLP

(57) ABSTRACT

In the capacitor in a semiconductor device, a nitride film is formed over a lower electrode on a semiconductor substrate, and a TaON film is formed over the nitride film. The $Al_2O_3$ film is formed over the TaON film, and an upper electrode is formed over the $Al_2O_3$ film.

7 Claims, 2 Drawing Sheets

CAPACITOR IN SEMICONDUCTOR DEVICE

This application is a divisional application Ser. No. 09/879,998, filed on Jun. 14, 2001, now U.S. Pat. No. 6,479,345, the entire contents of which are hereby incorporated by reference and for which priority is claimed under 35 U.S.C. §120; and this application claims priority of Application No. 2000-36811 filed in Republic of Korea on Jun. 30, 2000 under 35 U.S.C. §119.

BACKGROUND OF THE INVENTION

1. Field of the Invention

The invention relates to a capacitor in a semiconductor device.

2. Description of the Related Art

Recently, the need for memory elements has increased with developments of techniques for manufacturing semiconductor devices. In a semiconductor device, a capacitor is used as a means for storing data. The capacitance of such a capacitor depends on the electrode area and the dielectric constant of a dielectric film interposed between electrodes of the capacitor.

However, as semiconductor devices become more highly integrated, the capacitor area given in the semiconductor device is reduced. Accordingly, the electrode area of the capacitor decreases, thereby causing a reduction in the capacitance of the capacitor.

In order to solve this problem, a capacitor comprising a TaON thin film of a high dielectric constant has been proposed, in which the TaON film has a metal film-insulating film-silicon (MIS) structure. An upper electrode over the TaON thin film is formed using a laminated structure composed of a polysilicon film deposited on a TiN film in order to enhance interface characteristics.

FIG. 1 is a cross-sectional view illustrating a conventional capacitor with a TaON thin film in a semiconductor device. As shown in FIG. 1, according to the conventional capacitor manufacturing method, a TaON thin film 2 having a high dielectric constant is deposited over a lower electrode 1, for example, a polysilicon film.

Then, a TiN/polysilicon film 3 having a laminated structure is deposited over the TaON thin film 2. The deposition of the TiN/polysilicon film 3 is achieved by forming a TiN thin film in a CVD (Chemical Vapor Deposition) chamber using $TiCl_4$ as a precursor and $NH_3$ as a reaction gas. Thus, a capacitor with an MIS structure is completely formed.

However, there are some problems involved in the conventional capacitor of a semiconductor memory device.

For example, as semiconductor devices become more highly integrated, the cell size is reduced, even though the capacitance per cell requisite for stably driving the device does not vary. Therefore, the TaON thin film having a single layer structure cannot assure a high enough capacitance of the capacitor and suppression of leakage current at the same time.

Also, after the deposition of the TaON thin film as a dielectric film and before the formation of the polysilicon film as an upper electrode, the formation of a TiN thin film has to be carried out in the CVD chamber using $TiCl_4$ as a precursor and $NH_3$ as a reaction gas in order to enhance the interface characteristics of the TaON thin film and the polysilicon film. Accordingly, there is an increase in the manufacturing costs for the additional process.

SUMMARY OF THE INVENTION

Therefore, the present invention has been made in order to solve the above-mentioned problems in the related art. An object of the present invention is to provide a capacitor in a semiconductor device, which is capable of achieving an improvement in the interface characteristics while assuring a high capacitance and a low leakage current.

In accordance with one aspect, the present invention provides a capacitor comprising: a lower electrode; a nitride film formed on the lower electrode; a TaON film formed over the nitride film; an $Al_2O_3$ film formed over the TaON film; and an upper electrode formed on the $Al_2O_3$ film film.

BRIEF DESCRIPTION OF THE DRAWINGS

The above objects, and other features and advantages of the present invention will become more apparent after a reading of the following detailed description when taken in conjunction with the drawings, in which.

DESCRIPTION OF THE PREFERRED EMBODIMENTS

Now, a preferred embodiment according to the present invention will be described in detail, with reference to the annexed drawings.

Figure 1:
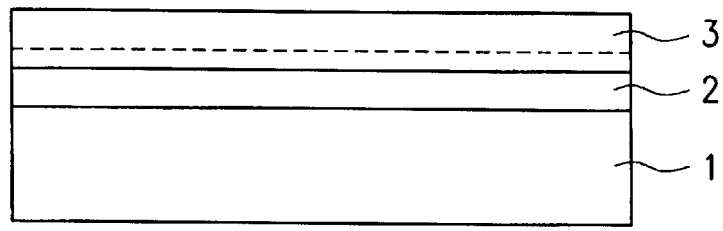
FIG. 1 is a cross-sectional view illustrating the capacitor in a semiconductor device in the prior art.
Figure 2A:
FIGS. 2A to 2D are cross-sectional views respectively illustrating the capacitor in a semiconductor device according to the present invention.

According to the present invention, as shown in FIG. 2A, a polysilicon film 10 is deposited as a lower electrode on a semiconductor substrate (not shown) The polysilicon film 10 is etched using HF or BOE (Buffer Oxide Etchant) to remove a natural oxide film formed on the surface thereof (not shown).

Then, a nitride film 20 is formed over the polysilicon film 10, in accordance with a plasma treatment using $NH_3$. The formation of the nitride film 20 over the polysilicon film 10, that is, the lower electrode, is carried out by conducting a plasma treatment in a chamber, kept at a pressure of 0.1 torr to 1.2 torr and a low substrate temperature of 300° C. to 500° C. for 10 to 600 seconds while supplying $NH_3$ gas in an amount of about 10 to 500 sccm and applying an RF power of 10 to 500 watt, thereby forming a nitride film.

Figure 2B:
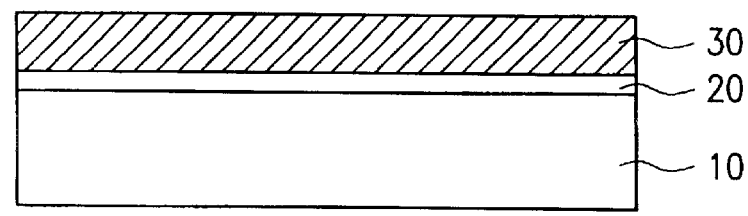

As shown in FIG. 2B, an amorphous TaON thin film 30 having a high dielectric constant is formed over the nitride film 20. Preferably, the formation of the amorphous TaON thin film 30 is carried out according to a PECVD (Plasma Enhanced Chemical Vapor Deposition) process. More particularly, the amorphous TaON film 30 is formed by evaporating 0.001 cc to 2 cc of tantalum ethylate (Ta$(OC_2H_5)_5$) as a raw material in a vaporizer, kept at 170° C. to 190° C., thereby producing Ta chemical vapor, and supplying the Ta chemical vapor to the PECVD chamber, to which $NH_3$ gas is supplied in a flow rate of 10 to 500 sccm, while maintaining the PECVD chamber at a low pressure of 0.1 torr to 1.2 torr and a temperature of 300° C. to 500° C. and applying an RF power of 10 to 500 watt.

Subsequently, the amorphous TaON thin film 30 is subjected to a thermal treatment in order to increase the proportion of nitrides in the TaON thin film. As the thermal treatment, an RTP (Rapid Thermal Processing) treatment is carried out for an annealing period of 60 to 180 seconds at a temperature 700° C. to 850° C. in a chamber supplied with $NH_3$ gas in a flow rate of 1 to 10 slm.

Figure 2C:
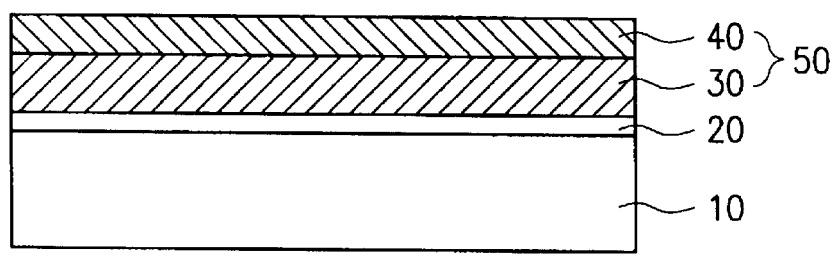

As shown in FIG. 2C, an $Al_2O_3$ film 40 is then deposited over the TaON thin film 30 resulting from the above thermal treatment to form a dielectric film so having a double-layer structure. The deposition of the $Al_2O_3$ film 40 is carried out by depositing an $Al_2O_3$ film using a raw material, of $(CH_3)_3Al$ as a precursor in a chamber, kept at a temperature of 200° C. to 450° C. and a pressure of 0.1 torr to 1 torr while supplying $H_2O$ gas. Thus, the dielectric film 50 is formed to have a laminated structure composed of the TaON thin film 30 and the $Al_2O_3$ film 40.

The dielectric film 50 is then subjected to a furnace vacuum thermal treatment in order to remove impurities and to prevent a crystallization and a loss of nitrides in the TaON thin film 40. The furnace vacuum thermal treatment of the dielectric film 50 is carried out using $N_2$ gas under the processing conditions of an annealing period of 5 to 60 minutes and a temperature or 600° C. to 850° C.

Figure 2D:
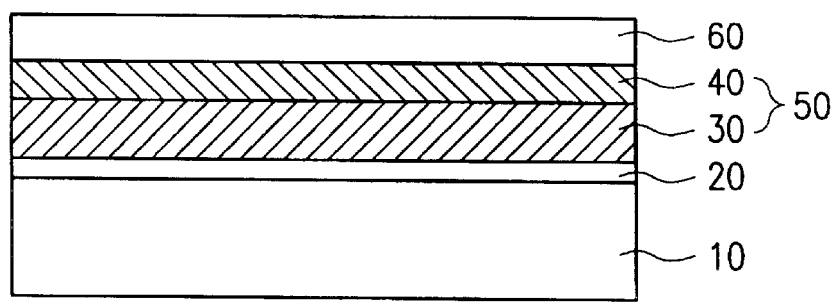

Finally, as shown in FIG. 2D, a polysilicon film 60 for an upper electrode is deposited over the dielectric film 50. Preferably, the polysilicon film 60 is deposited to a thickness of about 1,000 Å.

The lower electrode may have various structures, for example, a cylindrical structure or a stacked structure. Further, it may have a metal-in structure.

As described above, the capacitor of a semiconductor device according to the present invention has effects as follows.

In accordance with the present invention, the dielectric film has a double-layer structure composed of the TaON thin film and the $Al_2O_3$ film to assure a high capacitance and a low leakage current, as compared to the conventional dielectric film having a single layer structure. It is also possible to achieve an improvement in interface characteristics. Such an improvement in interface characteristics makes it possible to omit the deposition of the TiN film, which is involved in the conventional capacitor manufacturing method to improve the interface characteristics between the TaON thin film and the upper electrode. Thus, it is possible to simplify the entire process.

In addition, as semiconductor memory devices with improved characteristics can be formed, it is possible to achieve an increase in productivity.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed:

1. A capacitor comprising:
   a lower electrode;
   a nitride film formed on the lower electrode;
   a TaON film formed over the nitride film;
   an $Al_2O_3$ film formed over the TaON film; and
   an upper electrode formed on the $Al_2O_3$ film.

2. The capacitor according to claim 1, wherein the TaON film is an amorphous TaON thin film.

3. The capacitor according to claim 1, wherein the lower electrode has one of a cylindrical structure and a stacked structure.

4. The capacitor according to claim 1, wherein the TaON film forms an amorphous TaON thin film according to a PECVD (Plasma Enhanced Chemical Vapor Deposition) process.

5. The capacitor according to claim 1, wherein the $Al_2O_3$ film is formed by depositing an $Al_2O_3$ film using a raw material of $(CH_3)_3Al$ as a precursor in a chamber, kept at a temperature of 200° C. to 450° C. and a pressure of 0.1 torr to 1 torr while supplying $H_2O$ gas.

6. The capacitor according to claim 1, wherein as the upper electrode, a polysilicon film is deposited to a thickness of 1,000 Å.

7. The capacitor according to claim 1, wherein the lower electrode is formed of a polysilicon film.

* * * * *